May 11, 1937. J. W. FITZ GERALD Re. 20,357

TUNING DIAL

Original Filed March 14, 1929

Inventor

John Watson FitzGerald

By Ira Milton Jones

Attorney

Reissued May 11, 1937

Re. 20,357

UNITED STATES PATENT OFFICE 20,357

TUNING DIAL

John W. Fitz Gerald, Milwaukee, Wis., assignor to Briggs & Stratton Corporation, Milwaukee, Wis., a corporation of Delaware Original No. 1,744,265, dated January 21, 1930, Serial No. 347,036, March 14, 1929. Application for reissue March 23, 1937, Serial No. 132,615

20 Claims. (Cl. 116—124.2)

This invention relates to certain new and useful improvements in radio tuning dials.

Heretofore, the dials which have been used to control the tuning elements of radio receivers were manually actuated, and were provided with suitable delineations adjacent their periphery, with which a stationary marker carried by the panel cooperated to enable the operator to adjust the dial, and consequently the receiver to a desired frequency. However, this method required considerable patience and therefore automatic tuning devices were developed which enabled the operator to adjust the receiver to a desired broadcasting station by merely pressing a button.

Such automatic controls, however, were complicated and necessitated considerable change in the design of the receiver with which they were used.

It is, therefore, an object of this invention to provide an improved tuning dial for radio receivers and the like which may be quickly attached to any standard receiver without in any way altering its design or construction, and which is provided with means by which the operator is enabled to quickly move the dial to adjust the receiver to any of several predetermined frequencies.

Another object of this invention resides in the provision of an improved construction for radio tuning dials and the like which embodies the desirable features of an automatic control.

Another object of this invention resides in the provision of an improved radio tuning dial and the like, which is provided with a plurality of buttons or indicating devices, which may be individually moved to an operative position, whereby rotation of the dial and consequently the movement of the instrument controlled thereby is arrested at a predetermined position, indicated by the indicating device or button so actuated.

Another object of this invention is to provide simple means for adjusting the station selecting buttons or indicating devices on the dial so that each button may be adjusted to represent any one of a number of different broadcasting stations lying in a number of adjacent frequency channels.

With the above and other objects in view which will appear as the description proceeds, this invention resides in the novel construction, combination and arrangement of parts substantially as hereinafter described and more particularly defined by the appended claims, it being understood that such changes in the precise embodiment of the hereindisclosed invention may be made as come within the scope of the claims.

The accompanying drawing illustrates one complete example of the physical embodiment of the invention constructed according to the best mode so far devised for the practical application of the principles thereof, and in which.

Figure 1:
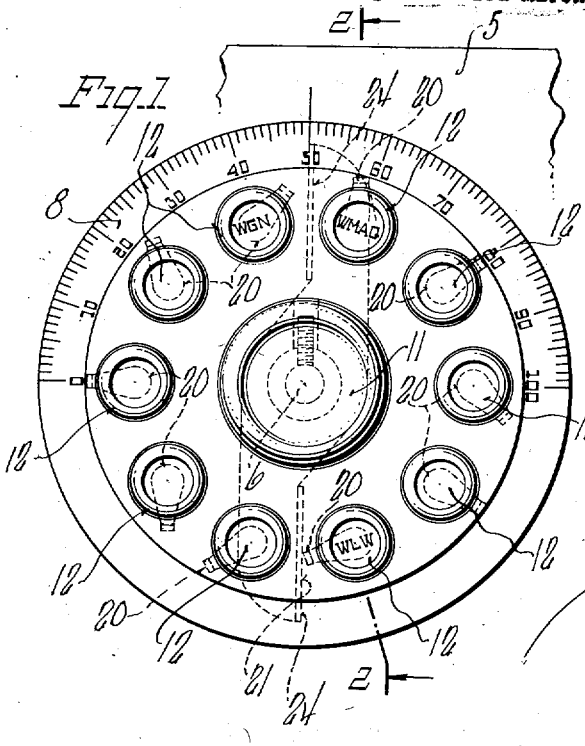
Figure 1 is an elevational view of a radio receiver dial embodying this invention.

Referring now particularly to the accompanying drawing in which like numerals indicate like parts throughout the several views, the numeral 5 represents the panel of a radio receiver, not shown, which usually includes one or more tuning elements for tuning the receiver to a desired frequency, and whose shaft 6 projects through an opening 7 in the panel to have a suitable actuating dial secured thereto.

In the present invention a dial 8, preferably formed of insulating material, such as a phenol condensation product, is secured to the shaft 6 by a set screw 9 or the like, and has the back of its major portion recessed, as at 10, for a purpose to be later described.

Surrounding the usual central knob 11 are a plurality of indicating devices or buttons 12 which are adapted to have the call letters of a number of desired broadcasting stations displayed thereon, the indicating devices or buttons 12 being depressible into the dial recess 10 to an operative position, whereupon rotation of the dial is arrested at a predetermined point, and the receiver tuned to the particular broadcasting station designated on the indicating device or button so actuated.

Figure 2:
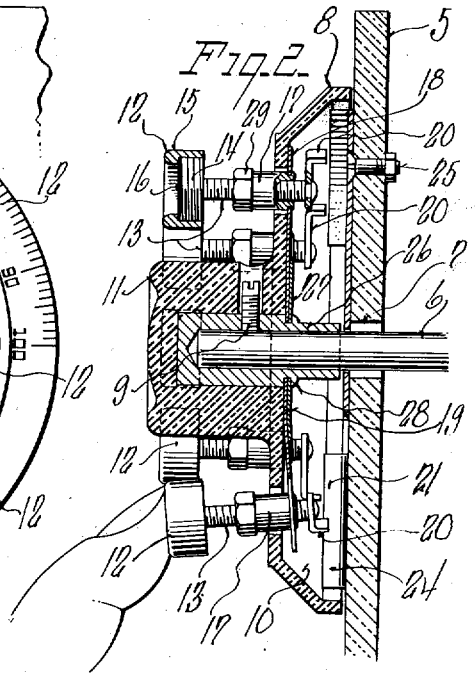
Figure 2 is a cross sectional view taken through Figure 1 on the plane of the line 2—2.
Figure 3:
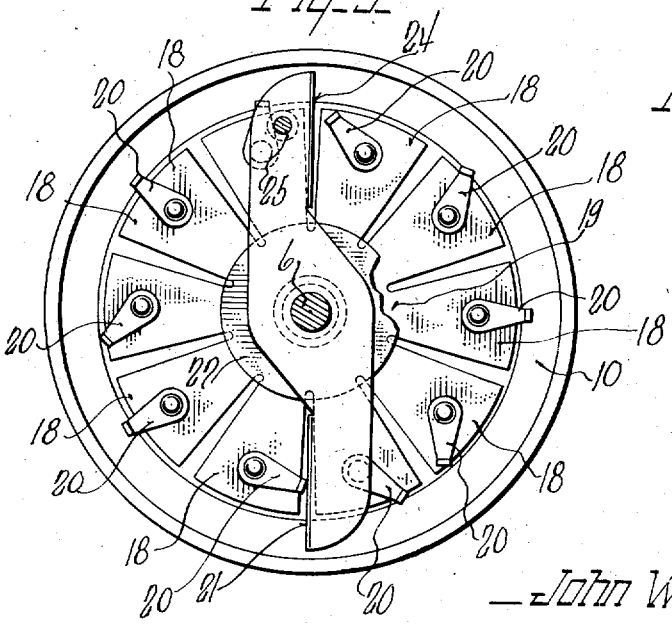
Figure 3 is a cross sectional view taken through Figure 2 on the plane of the line 3—3, and illustrating the back of the dial.
Figure 4:
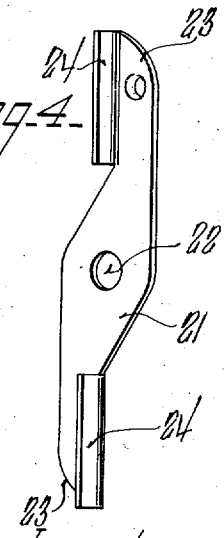
Figure 4 is a perspective view of the fixed stop which cooperates with adjustable stops carried by the dial to arrest movement thereof.

The buttons 12 each consist of a threaded stud 13 whose head 14 is externally threaded to receive a retaining shell 15 in which a paper or other suitable disc 16, upon which the station call letters are delineated, is positioned. The stud 13 is threaded in a sleeve 17 fixed to a segment 18 of a spring member 19 secured to the dial within its recess in a manner to be later described. The innermost end of the stud 13 has a stop member 20 fixed thereto, which consists substantially of a lever projected from the stud and whose outermost end is directed laterally to provide the stop proper. Depression of the button flexes the segment 18 of the spring member 19, as clearly illustrated in the lower half of Figure 2 and moves the stud and consequently the stop 20 into the path of a stationary stop member 21 fixed to the panel.

The stationary stop 21 is struck from bendable metal and has a central aperture 22 through which the shaft 6 extends, and diametrically opposed arms 23, the outer ends of which have laterally extended portions 24 which provide a pair of stationary stops with which the stops 20 carried by the indicating buttons are engageable, a screw 25 maintaining the member 21 in proper fixed position. Threading of the stud 13 into the sleeve 17 permits longitudinal adjustment of its stop, so that it will normally pass over the laterally projected portions 24 of the stop 21.

The spring member 19 is secured to the face of the recess 10 in the dial by having a portion of the metal hub 26 of the dial swedged, as at 28, over it and a washer 27 positioned outwardly of the member 19 to strengthen the same. The natural tendency of the spring member 19 is to maintain its several segments, to which the indicating buttons are fixed, in flat alignment, so that the stops 20 are normally held out of the path of the projections 24 of the stationary stop to permit free rotation of the dial, as will be readily apparent.

The radial position of the stops 20 permits them to be adjusted with respect to the rotation of the dial, to arrest the movement thereof at the proper point; the adjustment being accomplished by merely turning the indicating buttons and locking them against further rotation by suitable lock nuts 29.

The usual radio receiver is so designed that the shaft of its tuning elements revolves through one hundred and eighty degrees, and therefore the provision of stop buttons entirely around the dial provides stops for stations whose frequencies are comparatively close to each other. This advantage is illustrated in Figure 1 in which one stop button 12 is arranged to arrest the movement of the dial to tune the receiver to the broadcasting station W. G. N., and its adjacent button is arranged to stop the tuning element of the receiver at the frequency of the station W. M. A. Q.

The broadcasting station W. L. W. operates on a frequency between W. G. N. and W. M. A. Q., and as there are no indicating buttons between the two, which have been adjusted to the stations W. G. N. and W. M. A. Q., the button diametrically opposite that of W. G. N. is utilized to control the receiver when it is desired to tune the same to the broadcasting station W. L. W., the stop 20 of this latter button cooperating with the lowermost projection 24 of the fixed stop 21. In a similar manner, the remaining buttons may be adjusted to desired broadcasting stations.

From the foregoing description taken in connection with the accompanying drawing, it will be readily apparent to those skilled in the art to which this invention appertains, that this invention provides an improved dial for radio receivers and the like, which obtains in a single unitary device, the advantages of a complicated automatic control without in any way complicating the design of the receiver, and at an extremely low cost.

What I claim as my invention is:

1. In combination with a control for radio receivers having a tuning element movable to different positions for tuning the receiver to different broadcasting stations: means for quickly tuning the receiver to a particular broadcasting station, said means comprising a stationary stop; a movable stop connected with the tuning element, said movable stop normally being clear of the stationary stop; and means for actuating the movable stop and the tuning element to engage the movable stop with the stationary stop and thus quickly move the tuning element to a predetermined definite position at which the receiver is tuned to said broadcasting station.

2. In combination with a radio tuning control adapted to be moved to different positions for tuning a radio receiver to different broadcasting stations: a stationary stop; indicating means representing a predetermined broadcasting station operable to adjust the tuning control and including a stop engageable with the stationary stop to arrest the movement of the tuning control at a predetermined point at which the receiver is tuned to said predetermined station; and means for normally holding the indicating stop clear of engagement with the stationary stop.

3. A tuning device for radio receivers whereby the receiver may be quickly tuned to a predetermined broadcasting station comprising: a normally stationary abutment; a member movable to a definite position at which the receiver is tuned to said predetermined broadcasting station; a spring member carried by said movable member; and a stop device carried by the spring member and movable against the resiliency of the spring member to an operative position engageable with the abutment, said stop device being so located as to arrest the motion of the movable member at said predetermined position.

4. The combination with a rotatable radio tuning dial for tuning a radio receiver: of a stationary stop; a yieldable member carried by the dial to be movable therewith; and stop means carried by the yieldable member, said stop means being normally held in an inoperative position by said yieldable member and being movable against the resiliency of the yieldable member to a position engageable with the stationary stop for arresting rotation of the dial at a predetermined point.

5. The combination with a movably mounted control dial for radio receivers: of a stationary stop; yieldable means carried by the control dial; an indicating member carried by the yieldable means; and a stop carried by the indicating member and movable against the resiliency of the yieldable means to a position engageable with the stationary stop to arrest the movement of the dial at a predetermined point.

6. The combination with a movably mounted control dial for radio receivers: of a stationary stop; yieldable means fixed to the dial; a member having means for indicating a predetermined position of the movably mounted dial; and a stop carried by said member and movable into a position engageable with the stationary member upon depression of the indicating member against the resiliency of the yieldable means, to arrest the movement of the dial at said predetermined position.

7. The combination with a movably mounted control dial of the character described: of a stationary member; indicating means carried by the dial including a stop movable into engagement with the stationary member to arrest the movement of the dial; and means whereby said stop may be adjusted to arrest the movement of the dial at a predetermined point.

8. The combination with a movably mounted control dial of the character described: of a stationary stop; a movable stop carried by the dial and positionable to engage the stationary stop and arrest the movement of the dial; and means for adjusting said dial carried stop with respect to the dial whereby the movement of the dial may be arrested at a predetermined point.

9. A control device of the character described comprising: the combination with a normally stationary abutment; of a dial adapted for normal uninterrupted rotation; a plurality of indicating elements mounted on the dial for movement relative thereto and into positive engagement with the abutment; and said elements being arranged to provide handles to facilitate the quick rotation of the dial to the predetermined position indicated by the indicating element so moved.

10. The combination with a rotatable radio dial for tuning a radio receiver; of a stationary stop; a yieldable member rotatable with the dial; and stop means held in an inoperative position by the yieldable member and movable against the resiliency of the yieldable member to a position engageable with the stationary stop for arresting rotation of the dial at a predetermined point.

11. In a tuning device for radio receivers having a rotary tuning element: stops movable with the rotary tuning element, each representing a predetermined broadcasting station; a stationary stop; and manually controllable means for rendering any one of said first designated stops operable to engage the stationary stop and arrest rotation of the tuning element in a position at which the receiver is tuned to the station which the selected stop represents.

12. In a tuning device for radio receivers having a rotary tuning element; a member connected with the tuning element for imparting rotary adjustment thereto; stops carried by said member and adjustable circumferentially of said member, each of said stops representing a different broadcasting station; a stationary stop; and manually operable means for rendering any one of said first designated stops operable to engage the stationary stop and arrest rotation of the tuning element in a position at which the receiver is tuned to the station which the selected stop represents.

13. Means for tuning a radio receiver comprising: a movable tuning element adapted to be adjusted to different positions for tuning the receiver to different broadcasting stations; means for selectively adjusting the tuning element to any desired position; and other means for quickly adjusting the tuning element to a definite position at which the receiver is tuned to a predetermined broadcasting station, said last named means comprising a stationary stop and a movable stop cooperable therewith, the movable stop being movable to a position at which it will collide with the stationary stop and arrest motion of the tuning element at said predetermined definite position.

14. Means for tuning a radio receiver having a movable tuning element adapted to be adjusted to different positions for tuning the receiver to different broadcasting stations: means for quickly adjusting the tuning element to a definite position at which the receiver is tuned to a predetermined broadcasting station, said means comprising a stationary stop and a movable stop cooperable therewith, the movable stop providing means for transmitting adjusting motion to the tuning element and being movable to a position at which it will collide with the stationary stop to arrest the motion of the tuning element at said predetermined definite position.

15. Means for tuning a radio receiver having a front panel and a rotatable tuning element limited to one hundred and eighty degrees of rotation, comprising: a circular dial member exposed on the face of the front panel and connected with the tuning element so that rotation may be imparted to the tuning element by manual actuation of the dial member; station selecting devices circumferentially spaced about the entire three hundred and sixty degrees of the dial member, each representing a particular broadcasting station and including a normally inoperative stop capable of being manually rendered operative; and stationary stop means engageable by a station selecting stop which has been rendered operative for arresting rotation of the tuning element at a definite position within its one hundred and eighty degrees of rotation at which the receiver is tuned to the particular broadcasting station represented by the selected station selecting device.

16. Means for tuning a radio receiver having a front panel and a rotatable tuning element comprising: a dial member exposed on the face of the front panel and connected with the tuning element so that rotation may be imparted to the tuning element by manual actuation of the dial member; station selecting devices circumferentially spaced about the dial member, each representing a particular broadcasting station and each including a normally inoperative stop capable of being manually rendered operative; and stationary stop means engageable by a station selecting stop which has been rendered operative for arresting rotation of the dial member at a definite position holding the tuning element in a position at which the receiver is tuned to the particular broadcasting station represented by the selected station selecting device.

17. Means for tuning a radio receiver comprising: a rotary tuning element; cooperating stationary and movable indicating means for indicating any adjusted position of the tuning element, the movable indicating means being rotatable with the tuning element; a plurality of additional indicating means movable with the rotary tuning element, each of said additional indicating means representing a predetermined broadcasting station; a stationary stop; and means adapted to be depressed at any one of said additional indicating means into an operative position to collide with the stationary stop and arrest adjusting motion of the tuning element at a definite position at which the receiver is tuned to a station represented by the selected stop.

18. Means for tuning a radio receiver comprising: a rotary tuning element; cooperating stationary and movable indicating means for indicating any adjusted position of the tuning element; the movable indicating means being movable with the tuning element; a plurality of additional indicating means movable with the rotary element, each of said additional indicating means representing a predetermined broadcasting station, and providing a stop depressible to an operative position; and a stationary stop lying in the path of any depressible stop in operative position to be engaged thereby for arresting rotation of the tuning element at a definite point at which the receiver is tuned to the station represented by the selected depressible stop.

19. In a radio tuning device having a manually adjustable element for tuning the receiver to any selected station: means for quickly adjusting said element to a definite position to tune the receiver to a particular station, said means comprising a stationary stop; a movable stop; and an adjustable connection between the movable stop and said element including a rotatable stem carried by said element and means eccentrically mounting the stop on the stem, said stem being depressible to position the movable stop for engagement with the stationary stop.

20. In a radio tuning device: a rotary member; a station selector carried by the rotary member and comprising a rotatable stem; yieldable means mounting the stem from said rotary member in an adjusted position of rotation; a movable stop eccentrically mounted on the stem and movable to an operative position by depression of the stem against the resiliency of the yieldable means; and a stationary stop engageable by the movable stop when said movable stop is in its operative position for limiting motion of the rotary member at a predetermined point depending upon the adjustment of the stem.

JOHN W. FITZ GERALD.